United States Patent [19]

Farley

[11] Patent Number: 4,804,837

[45] Date of Patent: Feb. 14, 1989

[54] ION IMPLANTATION SURFACE CHARGE CONTROL METHOD AND APPARATUS

[75] Inventor: Marvin Farley, Ipswich, Mass.

[73] Assignee: Eaton Corporation, Cleveland, Ohio

[21] Appl. No.: 142,365

[22] Filed: Jan. 11, 1988

[51] Int. Cl.$^4$ .................. H01S 1/00; H01S 9/00
[52] U.S. Cl. .................. 250/251; 250/492.1
[58] Field of Search ........... 250/251, 492.21, 398; 315/111.81

[56] References Cited

U.S. PATENT DOCUMENTS

| 3,415,985 | 12/1968 | Castaing et al. | 250/251 |
|---|---|---|---|
| 3,507,709 | 4/1970 | Bower | 148/1.5 |
| 4,135,097 | 1/1979 | Forneris et al. | 250/492 B |
| 4,361,762 | 11/1982 | Douglas | 250/492.21 |
| 4,463,255 | 7/1984 | Robertson et al. | 250/251 |
| 4,585,945 | 4/1986 | Bruel et al. | 250/251 |
| 4,595,837 | 6/1986 | Wu et al. | 250/492.2 |

Primary Examiner—Bruce C. Anderson
Attorney, Agent, or Firm—F. M. Sajovec

[57] ABSTRACT

An ion beam neutralizer. High energy electrons are directed through an ion beam neutralizing zone or region containing an ionizable gas. As the high energy electrons collide with the gas molecules, they ionize the gas molecules and produce low energy electrons which are trapped by a positively charged ion beam. As high energy electrons pass out of the neutralizing zone they are deflected back to the neutralizing zone by a cylindrical conductor biased to deflect the high energy electrons and an accelerating grid for accelerating the electrons back through the beam neutralizing zone.

10 Claims, 5 Drawing Sheets

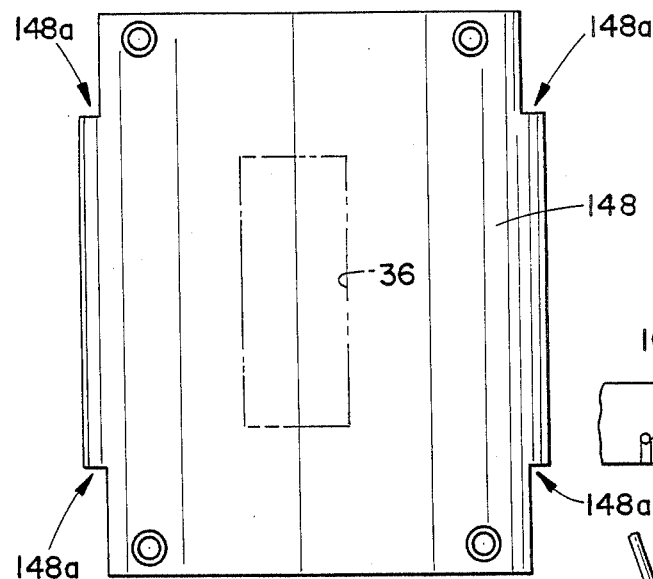
FIG. 6
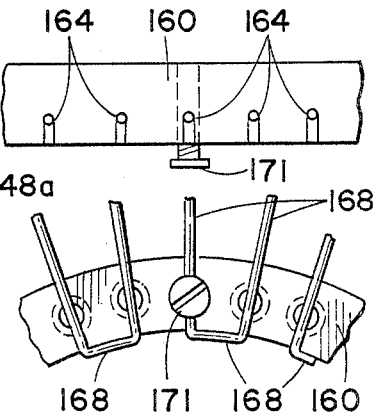
FIG. 8
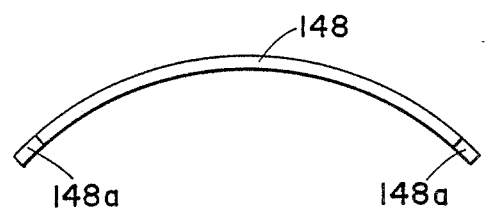
FIG. 7
FIG. 9
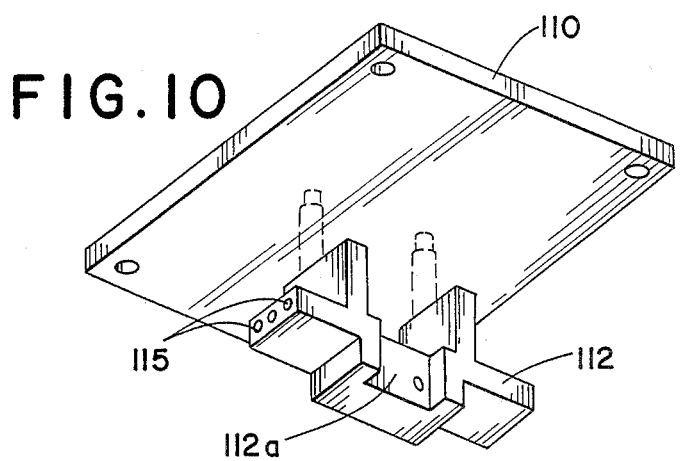
FIG. 10

ION IMPLANTATION SURFACE CHARGE CONTROL METHOD AND APPARATUS

TECHNICAL FIELD

The present invention relates to ion beam implantation of a workpiece and more particularly relates to a mechanism for providing an excess of low energy (thermal) electrons in and around an ion beam to control space charge within the beam. This minimizes charging of the surface of the workpiece which is particularly important when the workpiece is a silicon wafer being doped with an ion impurity.

When a wafer with insulating surfaces passes through an ion beam positive charging of the surface that intercepts the beam will occur. The rate at which such surface charging occurs is dependent upon four major factors. First, the positive ion beam charges the surface directly in proportion to $I_b$, the beam current. Second, when ions are stopped in the surface of the wafer, secondary electrons are ejected, adding to the net positive charging. Third, low energy electrons in the vicinity of the wafer are attracted to the positively charged wafer surface, thereby reducing net charging. Finally, leakage currents within the wafer are increased proportional to the surface voltage when the wafer surface charges positively. This reduces net charging.

Silicon wafers alternately layered with insulators and metal or more silicon can experience dielectric breakdown when wafer charging occurs. Although, the dielectric strength of thin $SiO_2$ films can be as high as 10 megavolts/cm, for a 100 Angstrom oxide thickness this stress is reached with only 10 volts of charging potential. Experimental devices are currently being fabricated with oxide thicknesses of about 130 angstroms, setting strict upper tolerance limits for any voltage created by beam charging effects.

As the surface of a wafer charges positively, electrons are swept from the ion beam, increasing the positive potential of the beam. Mutual repulsion of the positively charged beam particles creates radial defocusing of the ion beam, leading to a less uniform implanted dose.

BACKGROUND ART

Most high current ion implantation systems rely on electron trapping to compensate for the space charge of the ion beam. Electrons generated by ion beam ionization of a background gas can be trapped when such ionization occurs within the positive potential of the beam. The rate of ionization is determined by the collision frequency between ions and gas molecules, $N\sigma l I_b$. N is the residual gas density, $\sigma$ is the cross section for the reaction, 1 is the beam path length, and $I_b$ is the ion beam current. At 20° C., N is $3.3 \times 10^{16}$ molecules.-torr$^{-1}$cm$^{-3}$. A typical cross section $\sigma$ is $10^{-15}$ cm$^2$ and 1 is for example, 20 cm within a high gas pressure region of a typical implanter. Typical implant pressures are $10^{-5}$ to $10^{-4}$ torr which leads to an ionization rate of 0.0066 to 0.066 per beam particle. This ionization rate is adequate to maintain space charge neutrality if the electrons produced by the collisions are not lost due to external voltage sources attracting them from the beam.

In some high current ion implantation systems, a gas is deliberately leaked into the beam line to enhance the ionization process thereby providing space charge neutralization of the ion beam. The ionization efficiency of the ion beam at allowable gas pressures is, however, too low to permit use of a gas leak for control of wafer charging.

A plasma bridge can be used for neutralizing an ion beam and in principle can be used to control wafer surface charging simultaneously. Using this approach, a plasma is generated and bridged with the ion beam to provide a high current source of low energy electrons. The major shortcoming of this system is the high gas load presented to the system.

There are a number of known variations on the theme of electron shower systems. Most of these systems use low energy secondary electrons which are flooded directly onto wafers during implantation. The major shortcoming of this technique is that the spatial distribution of unlike charges is not equal. There is a negative halo around the positively charged beam center. This characteristic causes devices on the surfaces of wafers to be charged first negatively, then positively, and finally negatively, as the wafer passes through the beam. The net residual charge after the pass may be zero, but damage can be caused during the pass.

U.S. Pat. No. 4,463,255 to Robertson et al. recognizes disadvantages in direct electron shower charge neutralization of an implantation wafer. The U.S. Pat. No. 4,463,255 discloses a beam neutralization approach wherein a source of primary high energy electrons are directed to a target adjacent the ion beam. Secondary electrons produced as the primary electrons impact the target have low energy and can be trapped by the positively charged ion beam. This tends to neutralize he net charge of the beam and therefore reduces charge build up on the wafer as the ion beam impinges upon a wafer surface.

DISCLOSURE OF THE INVENTION

The present invention relates to a system for generating low energy electrons which can be acquired or trapped by a positively charged ion beam before the beam contacts a wafer. Rather than adopt the approach discussed in the Robertson et al. U.S. Pat. No. 4,463,255, the present invention confines high energy primary electrons within a region containing an ionizable gas. When the high energy electrons impact the gas molecules, low energy secondary electrons are generated and trapped by the positively charged ion beam.

In accordance with one embodiment of the invention, an ion beam implantation system includes an ion source for producing a positively charged ion beam and for directing that ion beam along a path causing it to impinge upon a workpiece having an insulating surface facing the ion beam. To avoid the aforementioned effects of wafer charging, apparatus of the invention includes a filament for directing high energy primary electrons through a beam neutralizing region or zone that is intersected by the ion beam before it reaches the wafer. An ionizable gas is introduced into the beam neutralizing region when the background pressure is too low, say $\leq 10^{-5}$ torr and collisions with the high energy primary electrons produces low energy secondary electrons that are trapped in the ion beam and control the net charge of that beam. High energy electrons that do not encounter gas molecules pass through the neutralizing region but are deflected by a repeller and a grid accelerates the electrons back through the beam neutralizing region.

In a preferred construction, the repeller is a conductive elongated cylinder having an inlet and outlet through which the ion beam passes. This repeller is biased at a potential causing the high speed primary electrons to be deflected away from the repeller back into the vicinity of the ion beam. Radially inward from an inner surface of the cylindrical repeller is a grid that is biased to accelerate the deflected electrons back into the region of the ion beam. A port in the repeller allows gas to be injected into the vicinity of the ion beam. Ionization of this gas by the high energy primary electron produces low energy, secondary electrons which are trapped by the ion beam.

The primary high energy electrons are generated from a filament which is biased by a power supply that can be adjusted to control filament current. An electrode accelerates electrons emitted by the filament into the beam neutralizing region. The filament and the accelerating electrode are positioned on the side of the repeller and electrically isolated from the repeller. Once the high energy primary electrons enter the ionization region, the goal is to cause the repeller to deflect these electrons back into the ionization region as many times as possible. To accomplish this goal, the surface area of the grid for re-accelerating the deflected electron is minimized to reduce collisions between the grid and the deflected electrons.

As the ion beam passes through the beam neutralizing region, the secondary electrons are trapped by the beam to produce a neutral ion beam by the time the ion beam leaves the neutralizing zone or region and passes to a point of impact with the workpiece.

From the above it is appreciated that one object of the invention is an ion beam neutralizing method and apparatus utilizing high energy electrons that are deflected back through a gas ionization zone to produce low energy beam neutralizing electrons. This and other objects, advantages and features of the invention will become better understood from a detailed description of a preferred embodiment which is described in conjunction with the accompanying drawings.

BRIEF DESCRIPTION OF THE DRAWINGS

FIG. 6 is a plan view of one of four repeller segments for deflecting electrons that travel through the beam neutralizer;

FIG. 7 is an end view of the FIG. 6 repeller section;

FIG. 8 is a plan view on an enlarged scale of a hub portion of a grid for accelerating electrons deflected by the FIG. 6 repeller;

FIG. 9 is an elevation view of the hub portion depicted in FIG. 8; and

FIG. 10 is a perspective view of a neutralizer support attached to a mounting plate that partially bounds the ion beam path.

BEST MODE FOR CARRYING OUT THE INVENTION

Figure 1:
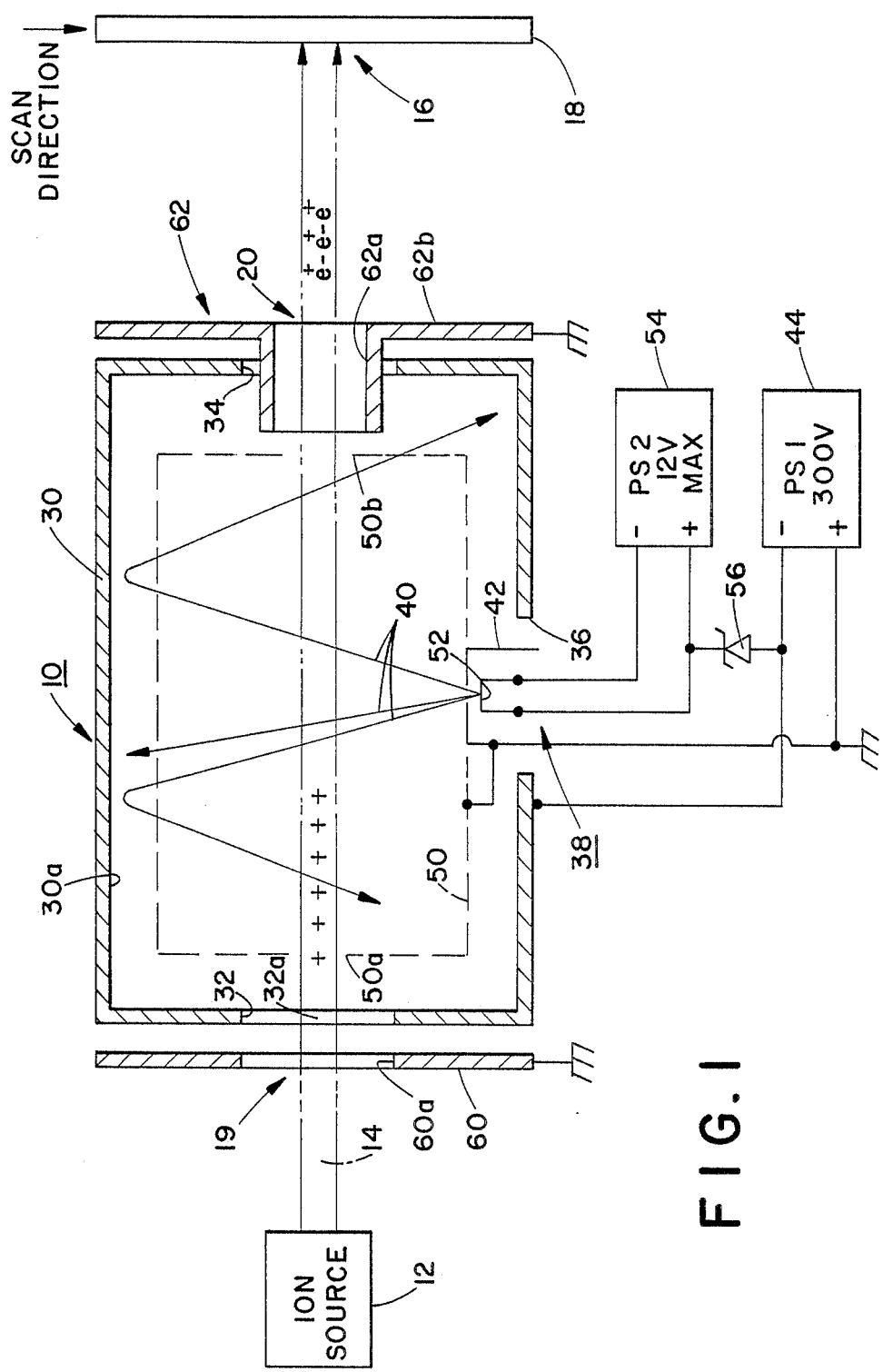
FIG. 1 is a schematic depiction of an ion beam passing through a beam neutralizer.

Turning now to the drawings, FIG. 1 is a schematic depiction of a beam neutralizer 10 constructed in accordance with the invention. An ion source 12 generates ions which are accelerated to form a high energy ion beam 14 which traverses a linear path to a wafer implantation station 16. At the wafer implantation station 16, a number of silicon wafers are mounted to a wafer support 18 that is moved in a controlled manner through the ion beam 14, causing controlled ion concentrations to strike the wafers. This dopes the silicon wafers with ion impurities to produce semiconductor characteristics in a controlled way. A representative ion implantation system where the support 18 is a spinning disk is disclosed in U.S. Pat. No. 4,228,358 to Ryding. The disclosure of this patent is incorporated herein by reference.

Due to the beam neutralizing effects of the neutralizer 10, at a beam exit 20 the ion beam 14 includes both the positively charged ions from the source 12 and low energy electrons trapped in the beam to control the charge and optimally neutralize the beam, i.e., produce a beam having no net charge. This avoids the serious damage that can be caused by allowing charge build-up on the semiconductor wafers.

The neutralizer 10 includes an electron repeller 30 that is a negatively biased cylindrical conductor partially closed at either end to define generally circular entrance and exit openings 32, 34. Along one side of the electron repeller 30 an opening 36 defines a position for a source 38 of high energy electrons 40 which are injected into an interior region of the repeller 30 in the vicinity of the beam path.

The high energy electrons 40 are accelerated by an electrode 42 so that when they collide with gas molecules in the region bounded by the electron repeller 30 the gas molecules are ionized and produce low energy electrons that can be trapped by the ion beam 14. High energy electrons that do not collide with gas molecules pass across the width of the neutralizer 10 and approach an inner wall 30a of the repeller 30. The electron repeller 30 is biased at an electrical potential negative with respect to a ground potential by a 300 volt power supply 44 to repel or reflect high energy electrons causing them to be deflected away from their initial trajectory from the source 38.

The deflected electrons are accelerated by an electric field created by a grid 50 constructed in the form of a cylindrical mesh held at ground potential. The grid 50 accelerates the deflected electrons back into the region of the ion beam 14 causing those electrons which do not initially impact the gas molecules to again travel through the region of the ion beam 14. It is one goal of the invention to maximize the number of electron traversals so that each electron has an increased chance of colliding with a gas molecule and producing low energy secondary electrons that can be trapped by the beam 14.

As the beam 14 enters the neutralizer 10 it may or may not be neutralized. A negatively biased aperture 32 defined by the repeller 30 is sandwiched between a grounded conductor 60 that defines an aperture 60a and a grounded aperture 50a of the grid 50. This arrangement provides a negative potential with a peak in the center 32a of aperture 32 which prevents low energy electrons from entering or leaving the beam neutralizer 10 through the aperture 60a, essentially isolating the electrons between the ion source 12 and the beam neutralizer 10 from the electrons between the beam neutralizer 10 and the workpiece support 18. As the beam enters the neutralizer 10 through the grid 50 it is made up of only positive ions from the ion source.

The electron source 36 preferably comprises a wire filament 52 that is energized by a low voltage, adjustable power supply 54 which heats the filament by applying a voltage of from zero to twelve volts D.C. across the filament. The power supply 54 is preferably maintained at an electric potential of approximately −275 volts by a 25 volt zener diode 56 coupled between a positive output from the supply 54 and the negative output of the 300 volt power supply 44.

Before entering the region bounded by the electron repeller 30 the ion beam 14 passes through a grounded annular conductor 60 co-axial with the repeller opening 32. At the exit 20, the ion beam 14 (containing captured free electrons) passes through a grounded exit conductor 62 before striking the wafer support 18. The grounded conductor 62 includes a cylindrical portion 62a co-axial with the ion beam and extending into the repeller 30 through the opening 34 and an annular plate portion 62b which extends radially away from the beam 14. The repeller 30 and the grounded conductor 60 suppresses high and low energy electrons from moving into or out of the neutralizer 10. The grounded cylindrical aperture 62 and the aperture 50b through the cylindrical grid 50 terminates the electric field from the repeller 30, thereby providing a field free region between the neutralizer 10 and the workpiece support 18. Electrons can move unimpeded to the workpiece 18.

Figure 2:
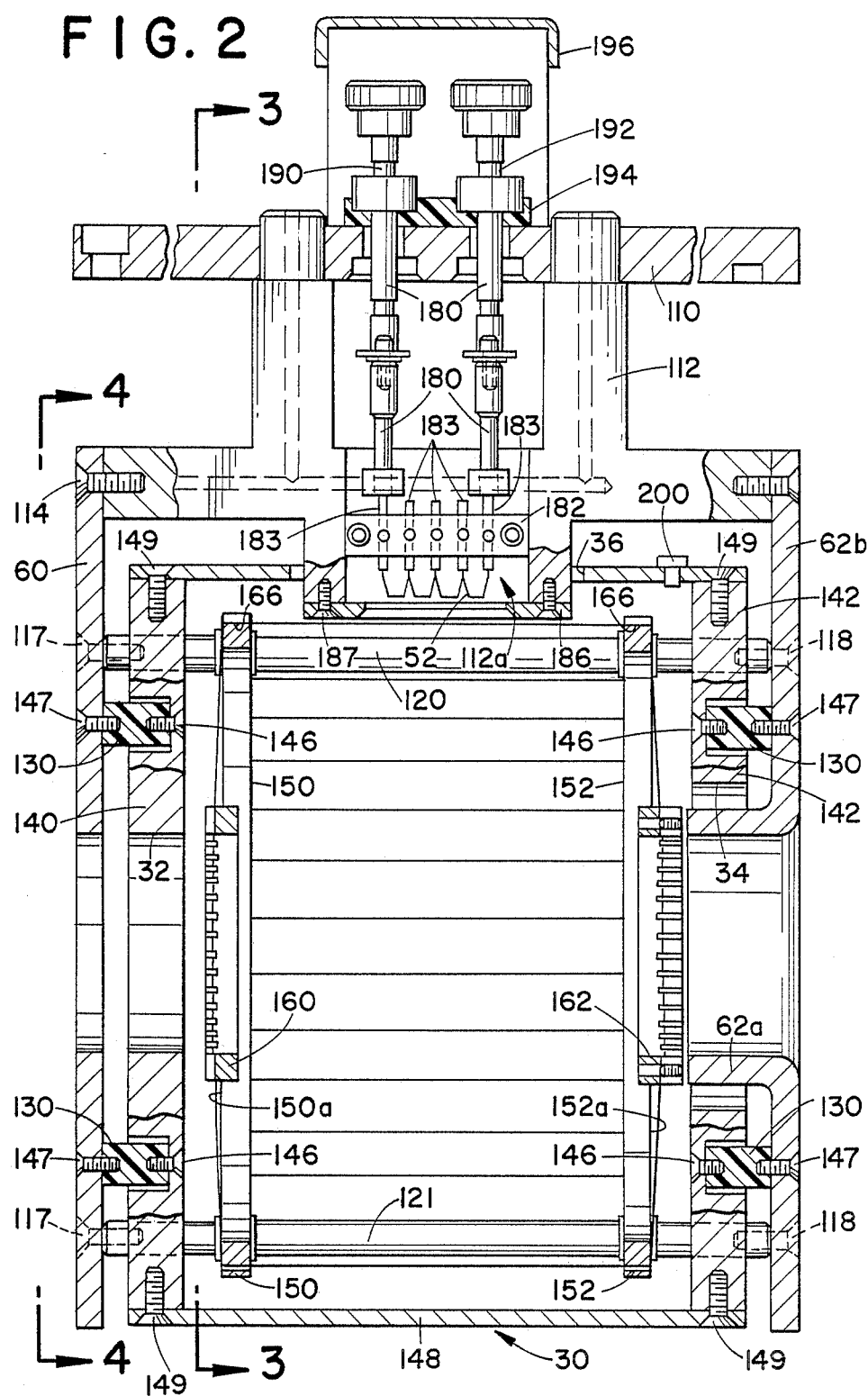
FIG. 2 is a partially sectioned view of a preferred embodiment of a beam neutralizer constructed in accordance with the invention.
Figure 3:
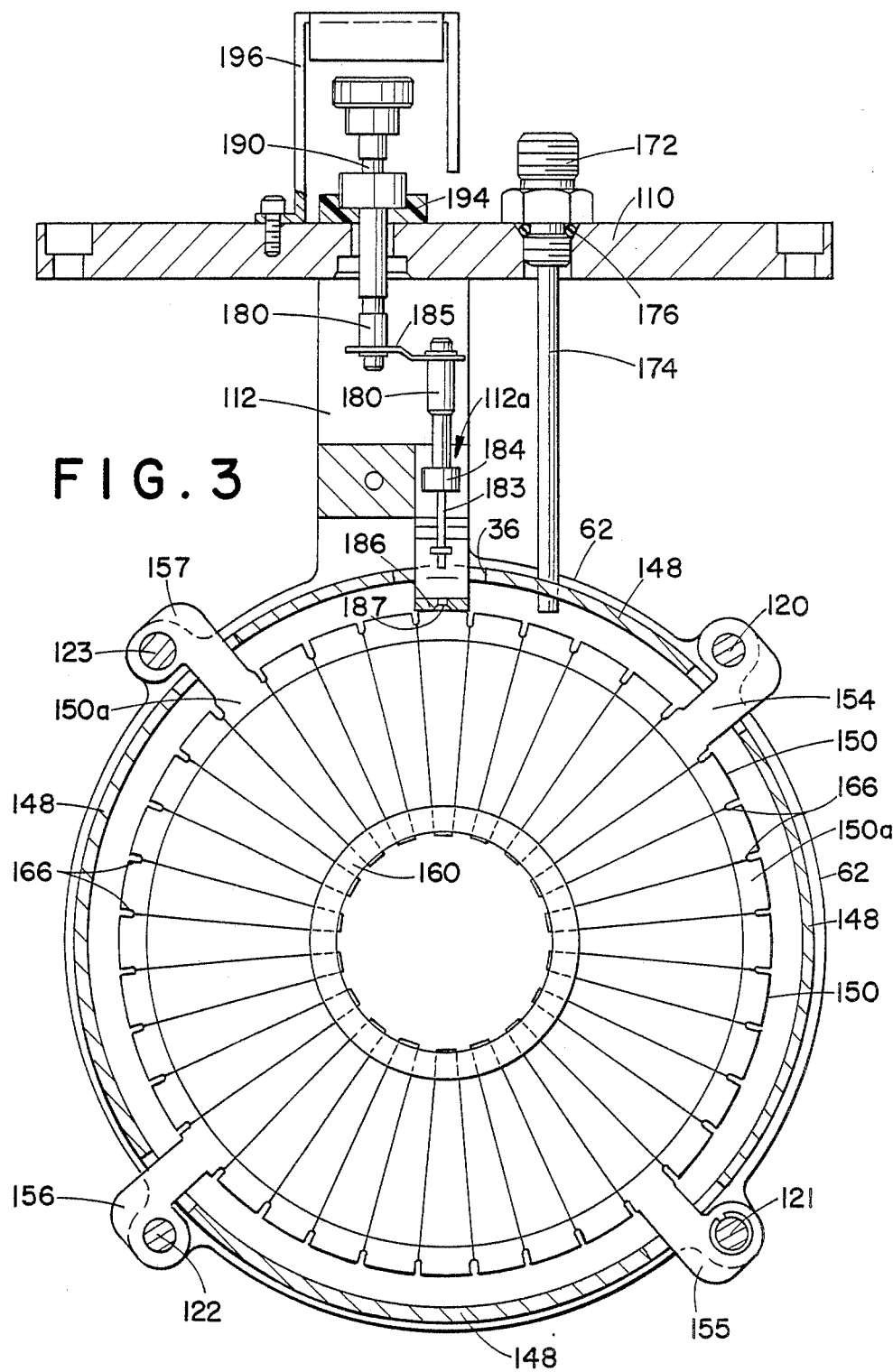
FIG. 3 is an end elevation view as seen from the plane defined by the line 3—3 in FIG. 2.

FIGS. 2 and 3 depict details of one embodiment of the beam neutralizer 10. The ion beam 14 passes through an evacuated chamber defined in part by a housing plate 110 which supports the cylindrical repeller 30 in relation to the ion beam path. When installed in an ion beam implant system, the plate 110 is generally horizontal so that in the FIG. 2 depiction, for example, the ion beam neutralizer 10 is supported beneath the housing plate 110.

Figure 4:
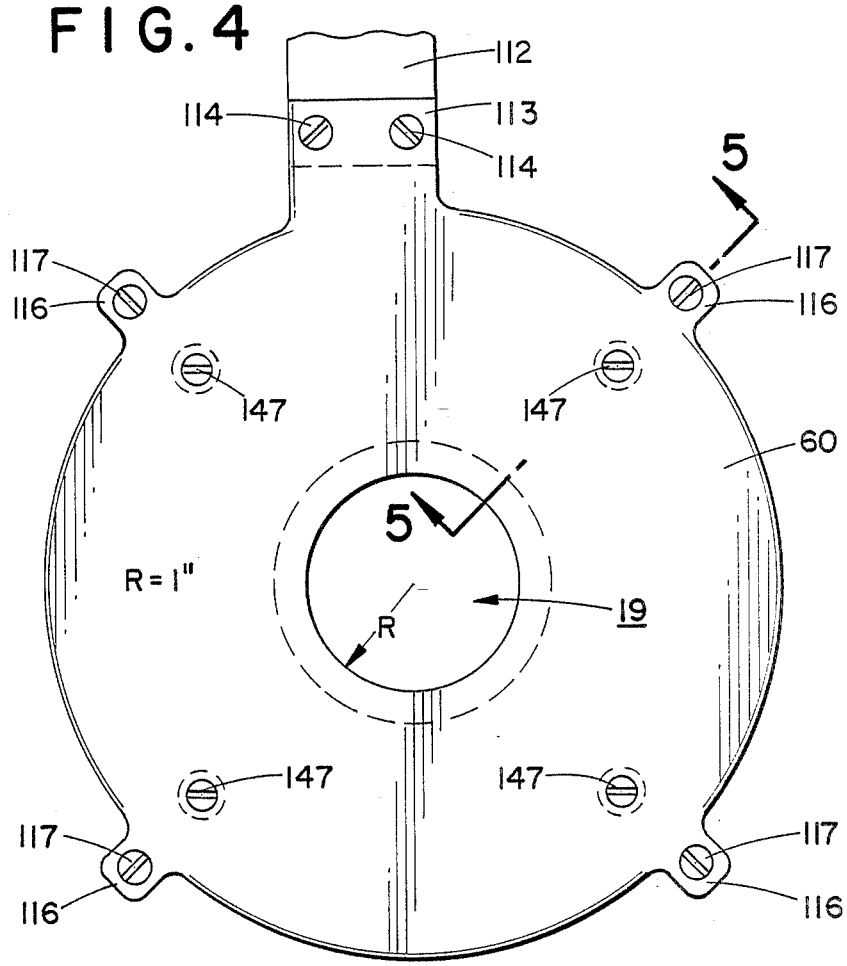
FIG. 4 is an end elevation view of a beam entrance of the FIG. 2 beam neutralizer.
Figure 5:
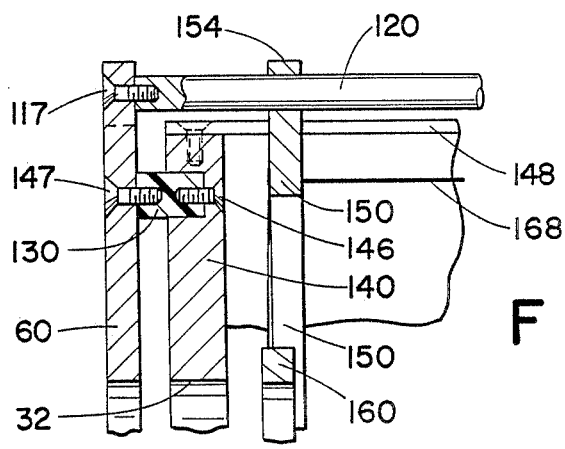
FIG. 5 is a section view as seen from the plane 5—5 of FIG. 4.

A downwardly extending aluminum support 112 (FIGS. 2 and 10) is maintained at electrical ground and supports both grounded conductors 60, 62. The conductor 60 (FIG. 4) is a metallic (preferably aluminum) disk having a mounting flange 113 at its outer periphery. The flange 113 is connected to the support 112 by threaded connectors 114 that extend through the flange 113 into openings 115 in the support 112 (FIG. 10).

The conductor 60 also includes four tabs 116 equally spaced about the conductor 60. The tabs 116 define spaced openings for connectors 117 which extend through the conductor 60 to engage ends of four equally spaced metallic (stainless steel) spacer rods 120, 121, 122, 123. Opposite ends of the rods 120–123 are connected to the exit conductor 62 by suitable connectors 118 (FIG. 2).

The cylindrical repeller 30 is supported by the ground conductors 60, 62. Insulating spacers 130 are interposed between the conductors 60, 62 and two annular repeller end pieces 140, 142 that define the entrance 32 and the exit 34 openings respectively. The end pieces 140, 142 are secured to the insulating members 130 by connectors 146 and the insulating spacers 130 are attached to the grounded conductors 60, 62 by connectors 147. The insulating members 130 allow the two repeller end pieces 140, 142 to be maintained at a negative potential (approximately 300 volts) with respect to the grounded conductors 60, 62. Four arcuate repeller walls 148 (each subtending an angle of 90°) are attached to the end pieces 140, 142 by connectors 149 that extend through the walls 148 into the cylindrical walls of the repeller end pieces 140, 142.

The grid 50 for accelerating electrons deflected by the repeller 30 is also supported by the metallic spacer rods 120–123. Two conductive (preferably titanium) rims 150, 152 each include outwardly extending arms 154–157 (FIG. 3) which fit over the spacer rods 120–123 to orient the rims 150, 152 inside the cylindrical repeller 30. Two metallic hubs (also titanium) 160, 162 are coupled to the rims 150, 152 by a tantalum wire meshwork which supports the hubs 160, 162 in co-axial relation with the ion beam 14. As seen in FIG. 3, the arms 154–157 extend through openings in the repeller walls 148. Each wall 148 defines four rectangular notches or cutouts 148a (FIG. 6) so that when the four repeller walls 148 are assembled the abutting walls define openings through which the arms 154–157 can extend.

To construct the grid 50 the two hubs 160, 162 are mounted on a mandrel (removed once the grid 50 is constructed) and a meshwork of tantalum wire is strung through slots 164 in an associated hub, routed over small slots 166 in the rim and then to the second rim inward to that rim's hub, etc. The completed meshwork of tantalum wire 168 extending in parallel fashion between the rims and radially inward to the hubs 160, 162 is seen in FIGS. 2 and 3. These wires are grounded since they are connected to the rims 150, 152 which are connected to the conductors 60, 62 by the spacer bars 120–123.

The slots 164 in each hub interrupt threaded holes 170 (FIG. 9) extending through both hubs 160, 162. Once the meshwork of tantalum wire has been strung screws 171 (FIG. 9) are threaded into the holes 170 until the screw 171 contacts the tantalum wires 168. Continued tightening of the screws 171 tensions the wire.

The individual wires 168 of the grid 50 extend radially inward from end faces 150a, 152a of the two rims 150, 152. To distinguish between the outwardly facing end faces 150a, 152a and the wires 168 of the grid 50 in FIG. 2 the wires have been axially displaced to form a small angle with the radially inward direction. It is appreciated, however, that once the meshwork of the grid 50 is tightened, the radially extending wires 168 and end faces 150a, 152a are essentially co-planar.

Ionizable gas is routed into the vicinity of the ion beam 14 through a fitting 172 (FIG. 3) and conduit 174 that feeds gas through the plate 110. A threaded opening in the plate 110 receives the fitting 172 and an "O" ring 176 prevents gas from leaking through the interface between the fitting and the plate 110. In a preferred embodiment of the invention Argon is routed into the region traversed by electrons since it is easily ionized.

A position of the opening 36 in the repeller wall 148 facing the plate 110 is depicted in FIG. 6. This opening 36 allows the filament 52 to be mounted radially inward of the repeller walls 148. As seen in FIGS. 2 and 10 the support 112 defines a channel 112a for routing filament energizing signals to the filament 52. An insulating block 182 (preferably Boron Nitride) supports the filament 52 in the position seen in FIG. 2. The insulating block 182 is coupled to the support and defines five throughpassages that orient five tungsten rods 183 held in place by set screws. Two of the rods extend upward from block 182 and are coupled to conductors routed through insulating conduit 180. A collar 184 engages both the rods 183 and the conductors and is held in place by a set screw. As seen in FIG. 3 a metal (preferably silver) clip 185 routes energization signals between two portions of the conduit 180. This clip bends and accommodates expansion and contraction of the conductor as the filament 52 heats and cools.

The filament 52 (preferably tungsten) includes four loops that are welded at the ends and middle to the tungsten rods 183. By raising or lowering the tungsten rods 183 the position of the filament can be adjusted. The four loops and three connections in the middle of the filament to the rods 183 make the filament more durable.

An aperture defining conductor 186 (preferably graphite) is spaced from the filament 52 and attached to the support 112 by threaded connectors 187. The aperture is a narrow elongated opening which allows electrons from the filament 52 having an appropriate initial trajectory to exit through the aperture into the region bounded by the repeller 30. Since the conductor 186 is grounded it serves as the electrode for accelerating electrons from the filament 52 into the region bounded by the repeller.

Two terminals 190, 192 above the plate 110 are connected to the filament energizing power supply 54. Since these terminals are approximately 275 volts below ground a block 194 that feeds the conduit 180 through the plate 110 insulates the plate 110 from the terminals 190, 192. A cover 196 for the terminals 190, 192 is attached to the grounded plate 110. The cover 196 shields the terminals 190, 192 from inadvertent contact by personnel near the ion implanter while allowing energizing potential to be coupled from the power supply 54 to the filament 52. An additional terminal (not shown) routes a −300 volt signal through the plate 110 to an insulated conductor having an exposed end coupled by a connector 200 to the repeller wall. This maintains the repeller 30 at 300 volts below ground to repel high energy electrons that pass from the filament 52 through the region bounded by the repeller. The grounded grid 50 then attracts the deflected electrons and accelerates them back through the region of the ion beam to hopefully impart a gas molecule and produce a neutralizing electron. By adjusting both the power supply potential across the filament 52 and spacing of the filament with respect to the electrode 42 the electron current entering the neutralizing region can be adjusted.

The present invention has been described with a degree of particularity. It is the intent, however, that the invention include all modifications and/or alterations falling within the spirit or scope of the appended claims.

I claim:

1. In an ion beam implantation system that includes an ion source for producing a positively charged ion beam and for directing said ion beam along a path to impinge on a workpiece, apparatus for controlling ion beam charging of the workpiece comprising:
   (a) source means for directing high energy electrons through a beam neutralizing region that is intersected by said ion beam;
   (b) means for providing an ionizable gas in the beam neutralizing region that collide with said high energy electrons to provide low energy secondary electrons that are trapped by the ion beam to reduce the charge of said ion beam;
   (c) repeller means for deflecting high energy electrons that pass through said beam neutralizing region back toward said beam neutralizing region; and
   (d) grid means for accelerating electrons deflected from the repeller means back into the beam neutralizing region.

2. The apparatus of claim 1 where the repeller means comprises a conductive elongated cylinder which bounds said beam neutralizing region, said cylinder having an inlet opening and an outlet opening at opposite ends of the cylinder to allow said ion beam to pass through said cylinder.

3. The apparatus of claim 1 where the source means comprises a filament wire, a power supply to energize the filament wire, an electrode to accelerate electrons emitted by the wire to the beam neutralizing region, and a power supply to bias the electrode relative the filament wire.

4. The apparatus of claim 3 wherein the grid means comprises a wire mesh that forms a cylinder inside the conductive elongate cylinder of said repeller means and which is maintained at the same electric potential as the electrode which accelerates electrodes leaving the filament wire.

5. A method for controlling ion beam charging of a workpiece placed in an ion beam path comprising the steps of:
   (a) directing the ion beam along a beam path to cause said ion beam to impinge upon a workpiece;
   (b) injecting high energy electrons through a volume intersected by the ion beam containing ionizable gas prior to ion beam impingement on the workpiece to ionize gas molecules in the volume and produce secondary low energy electrons which are attracted to the ion beam and neutralize the charge of said beam to reduce charge build up on the workpiece; and
   (c) changing a trajectory of high energy electrons that pass through the volume containing said ionizable gas and then accelerating re-directed electrons back into the volume containing the ionizable gas to ionize additional gas molecules in the volume.

6. The method of claim 6 wherein high energy electrons are emitted from a filament and accelerated to the high energy by an accelerating electrode.

7. In an ion beam implantation system comprising:
   (a) a source for producing a positively charged ion beam and for directing said ion beam along a path to impinge on a workpiece;
   (b) wafer positioning means for positioning a workpiece within the ion beam;
   (c) electron producing means positioned along an ion beam travel path for directing high energy electrons through a beam neutralizing region that is intersected by said ion beam;
   (d) means for providing an ionizable gas in the beam neutralizing region that collide with said high energy electrons to provide low energy secondary electrons that are trapped by the ion beam to reduce a net charge of said ion beam;
   (e) repeller means for deflecting high energy electrons that pass through said beam neutralizing region without colliding with gas molecules back toward said beam neutralizing region;
   (f) grid means for accelerating electrons deflected from the repeller means back into the beam neutralizing region; and
   (g) power supply means for biasing the repeller means at a potential below the grid means.

8. The system of claim 7 wherein the repeller means comprises a metal cylinder closed in at an entrance and exit by annular aperture defining disks.

9. The system of claim 8 wherein the grid means comprises a wire tantalum mesh supported inside the cylinder and having an mesh entrance and mesh exit coaxial with the repeller entrance and exit.

10. The system of claim 7 wherein the electron producing means comprises a wire filament, a low voltage adjustable power supply for energizing the filament, a metal electrode for accelerating electrons from the filament and a power supply for biasing the filament below the electrode.

* * * * *